(12) United States Patent
Kim et al.

(10) Patent No.: US 6,740,613 B2
(45) Date of Patent: May 25, 2004

(54) DIELECTRIC CERAMIC COMPOSITION

(75) Inventors: Woo Sup Kim, Kyungki-do (KR);
Kang Heon Hur, Kyungki-do (KR);
Jong Han Kim, Kyungki-do (KR);
Joon Hee Kim, Kyungki-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 86 days.

(21) Appl. No.: 10/123,138

(22) Filed: Apr. 17, 2002

(65) Prior Publication Data

US 2003/0100427 A1 May 29, 2003

(30) Foreign Application Priority Data

Nov. 13, 2001 (KR) ........................... 2001-70538

(51) Int. Cl.$^7$ ................. C04B 35/462; C04B 35/495
(52) U.S. Cl. ........................ 501/134; 501/136
(58) Field of Search ................. 501/134, 136, 501/135

(56) References Cited

U.S. PATENT DOCUMENTS

| | | | | |
|---|---|---|---|---|
| 4,665,041 A | * | 5/1987 | Higuchi et al. | 501/134 |
| 5,356,843 A | * | 10/1994 | Okuyama et al. | 501/134 |
| 5,470,808 A | | 11/1995 | Okuyama et al. | 501/134 |
| 5,493,262 A | * | 2/1996 | Abe et al. | 333/219 |
| 5,700,745 A | * | 12/1997 | Okuyama et al. | 501/134 |
| 6,184,165 B1 | * | 2/2001 | Kawata | 501/32 |
| 6,242,375 B1 | * | 6/2001 | Hong et al. | 501/134 |

* cited by examiner

Primary Examiner—Karl Group
(74) Attorney, Agent, or Firm—Lowe Hauptman Giman & Berner LLP

(57) ABSTRACT

A dielectric ceramic composition of high dielectric constant and low dielectric loss, which can be co-fired with Ag electrodes, is provided for use in various parts of electric and electronic appliances. The composition is represented by the following chemical formula:

$$a \text{ wt. }\% \{xZrO_2-yZnO-wNb_2O_5-zTiO_2\}+c\text{wt. }\% \text{ glass frit}$$

wherein, $5.0 \text{ mol }\% \leq x \leq 45.0 \text{ mol }\%$; $1.5 \text{ mol }\% \leq y \leq 19.0 \text{ mol }\%$; $1.5 \text{ mol }\% \leq w \leq 19.0 \text{ mol }\%$; $40.0 \text{ mol }\% \leq z \leq 59.0 \text{ mol }\%$ with the proviso that $x+y+w+z=100$, $75.0 \leq a \leq 97.0$, and $3.0 \leq c \leq 25.0$.

4 Claims, No Drawings

DIELECTRIC CERAMIC COMPOSITION

BACKGROUND OF THE INVENTION

1. Field of the Invention

The present invention relates to a dielectric ceramic composition which is widely used in high frequency electronic components and, more particularly, to a low-temperature cofired dielectric ceramic composition with a high dielectric constant and a low dielectric loss.

Low-temperature cofired dielectric compositions (materials) means compositions(materials) which can be fired in the temperature range of 800-950° C., lower than the melting point of silver (Ag) or copper (Cu), in contrast to the conventional ceramic dielectrics which are sintered at 1,300° C. or higher.

2. Description of the Prior Art

The strong recent tendency toward miniaturization, lightness and intelligence of electric and electronic appliances has demanded a considerable reduction in the size and number of substituent devices on circuit boards as well as the high performance thereof. To meet the demands, there have been made extensive attempts in some of which part-on-boards are multi-layered, followed by firing dielectrics and electrodes simultaneously.

However, high sintering temperatures of conventional dielectric materials require the use of high melting temperature metals, such as Mo or W, in inner electrode patterns in order to achieve the multilayering and simultaneous firing of circuit boards and device parts.

Where Mo or W is adopted in inner electrode patterns, however, an economic disadvantage is incurred because of its high cost. Above all, the skin effect, which causes radio frequency current to stay near the surface of a conductor, requires that metals of low electric resistance be used for the electrode patterns in order to reduce the dielectric loss. Accordingly, there have been indispensably used metals that are relatively inexpensive as well as being of high electric conductivity, like Ag or Cu.

As Ag or Cu is used in inner electrode patterns, a very important research subject is to find a dielectric material which can be fired at lower than the melting point of Ag (960° C.) or Cu (1083° C.).

Typically, low-temperature fired dielectrics are prepared by liquid-phase sintering an admixture comprising high-temperature fired material with a high dielectric constant and low dielectric loss in combination with a small amount of a low melting point material, for example, glass powder or an additive such as CuO, PbO and $Bi_2O_3$, $V_2O_5$, etc., or by firing glass ceramics comprising ceramics as a filler.

When the latter is used, the resulting dielectric substrates based on glass show a dielectric constant of 10 or less.

With advantages of low dielectric constants in speeding-up signal processing and improving signal transmission, materials with a low dielectric constant of 10 or less are extensively used for low temperature cofired ceramics (LTCC).

Meanwhile, depending on characteristics of applied circuits, substrates made of dielectrics with low dielectric loss and medium dielectric constant (15–100) may often enjoy advantages in terms of circuit design and function without retardation of signal processing.

As a rule, however, use of dielectrics with high dielectric constants makes the guided wavelength short, leading to a reduction in circuit dimension. Thus, such dielectrics are very useful in applications which attach importance to dimensions of electric elements, as well as having the advantage of reducing insertion loss properties or frequency deviation according to circuits.

Larger dielectric constants can lower the ratio of the width of transmission lines to the thickness of dielectrics to greater extents, giving circuit designers an opportunity to design better lamination structures.

$ZrO_2$—AO—$B_2O_5$—$TiO_2$ (A=Zn, Mg, Co, Mn, and B=Nb, Ta)-based dielectric compositions with dielectric constants of approximately 40 or higher are disclosed in U.S. Pat. No. 5,470,808. These dielectric compositions can be fired at temperatures of 1,300° C. or higher, which are too high to co-fire Ag electrodes. That is, $ZrO_2$—AO—$B_2O_5$—$TiO_2$ (A=Zn, Mg, Co, Mn, and B=Nb, Ta)-based dielectric compositions alone have difficulty in being used for TLCC.

SUMMARY OF THE INVENTION

Therefore, it is an object of the present invention to overcome the above problems encountered in prior arts and provide a dielectric ceramic composition which exhibits high dielectric constant and low dielectric loss and can be sintered at low temperature.

It is another object of the present invention to provide a dielectric ceramic composition which is improved in sintering properties as well as being controllable in high frequency dielectric properties.

In accordance with an aspect of the present invention, there is provided a dielectric ceramic composition represented by the following chemical formula 1:

$a$ wt. % $\{xZrO_2-yZnO-wNb_2O_5-zTiO_2\}+c$wt.
% Glass Frit      Chemical Formula 1 wherein, 5.0 mol %≦x≦45.0 mol %; 1.5 mol %≦y≦19.0 mol %; 1.5 mol %≦w≦19.0 mol %; 40.0 mol %≦z≦59.0 mol % with the proviso that x+y+w+z=100; 75.0≦a≦97.0; and 3.0≦c≦25.0.

In accordance with another aspect of the present invention, there is provided a dielectric ceramic composition represented by the following chemical formula 2:

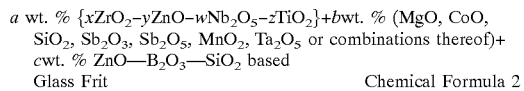

wherein, 5.0 mol %≦x≦45.0 mol %; 1.5 mol %≦y≦19.0 mol %; 1.5 mol %≦w≦19.0 mol %; 40.0 mol %≦z≦59.0 mol % with the proviso that x+y+w+z=100; 75.0≦a≦97.0; b≦1.5; and 3.0≦c≦25.0).

In accordance with a further aspect of the present invention, there is provided a dielectric ceramic composition represented by the following chemical formula 3:

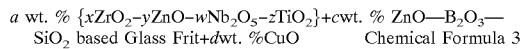

wherein, 5.0 mol %≦x≦45.0 mol %; 1.5 mol %≦y≦19.0 mol %; 1.5 mol %≦w≦19.0 mol %; 40.0 mol %≦z≦59.0 mol % with the proviso that x+y+w+z=100; 75.0≦a≦97.0; 3.0≦c≦25.0; and d≦5.0.

In accordance with still a further aspect of the present invention, there is provided a dielectric ceramic composition represented by the following chemical formula 4:

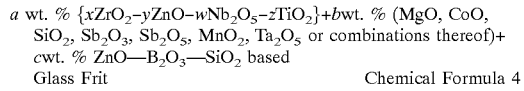

wherein, 5.0 mol %≦x≦45.0 mol %; 1.5 mol %≦y≦19.0 mol %; 1.5 mol %≦w≦19.0 mol %; 40.0 mol %≦z≦59.0 mol % with the proviso that x+y+w+z=100; 75.0≦a≦97.0; b≦1.5; 3.0≦c≦25.0; and d≦5.0)

DETAILED DESCRIPTION OF THE INVENTION

Based on $ZrO_2$—$ZnO$—$Nb_2O_5$—$TiO_2$ with low dielectric loss and high dielectric constant (>45), the dielectric composition of the present invention comprises $ZnO$—$B_2O_3$—$SiO_2$ glass frit as a sintering aid, thereby exhibiting a high electric constant of 30 or more and low dielectric loss (Q>1,000 (at 3 GHz), Q≈1/tan δ), and being able to be cofired with Ag electrode patterns.

To the composition, at least one oxide selected from the group consisting of MgO, CoO, $SiO_2$, $Sb_2O_3$, $Sb_2O_5$, $MnO_2$, and $Ta_2O_5$, and/or CuO may be further incorporated. In the dielectric composition, the oxide is used to improve dielectric properties while CuO acts as a sintering aid.

As described above, the ceramic composition of $ZrO_2$—$ZnO$—$Nb_2O_5$—$TiO_2$ is low in dielectric loss and 45 or higher in dielectric constant and is sintered at 1,300° C. The high sintering temperature makes it impossible to sinter the ceramic composition with electrodes made of Ag whose melting point is 961° C.

In accordance with the present invention, the base ceramic composition $ZrO_2$—$ZnO$—$Nb_2O_5$—$TiO_2$ is modified in the molar ratio of its constituting ingredients, and is incorporated with a certain amount of glass frit so as to make it possible to co-fire the ceramic composition with the Ag electrode. For use in the present invention, the base ceramic composition $ZrO_2$—$ZnO$—$Nb_2O_5$—$TiO_2$ comprises $ZrO_2$ (x) in an amount of 5.0~45 mol %, ZnO (y) in an amount of 1.5~19.0 mol %, $Nb_2O_5$ (W) in an amount of 1.5~19.0 mol %, and $TiO_2$ (z) in an amount of 40~59.0 mol % with the proviso that x+y+w+z=100.

With ZnO or $Nb_2O_5$ in an amount less than 1.5 mol %, the base ceramic composition is not sintered at 1,300° C. such that its dielectric properties cannot be measured. More than 1.5 mol %, both ZnO and $Nb_2O_5$ can function to improve sintering properties. Increasing of ZnO and $Nb_2O_5$ contents causes the base ceramic composition to increase in dielectric constant as well as in temperature coefficient of frequency (TCF) from the negative to the positive direction. On the other hand, at more than 19.0 mol % of ZnO or $Nb_2O_5$, the sintering density decreased while the temperature coefficient of resonant frequency is excessively increased in the positive direction.

Below 5 mol % of $ZrO_2$, the temperature coefficient of resonant frequency is too high in the positive direction to apply the base ceramic composition in practice. On the other hand, when the content of $ZrO_2$ is over 45 mol %, the base ceramic composition is not sintered even at 1,400° C.

As for $TiO_2$, its content is defined in the range of 40–59.0 mol % by the predetermined molar ratios of $ZrO_2$, ZnO and $Nb_2O_5$.

Useful in the present invention is a $ZnO$—$B_2O_3$—$SiO_2$ based glass frit. Preferably, it comprises ZnO in an amount of 30–70 wt %, $B_2O_3$ in an amount of 5–30 wt %, $SiO_2$ in an amount of 5–40 wt %, and PbO in an amount of 2–40 wt %.

$B_2O_3$ lowers the viscosity of the glass and accelerates the densification of the dielectric ceramic composition of the present invention. Where $B_2O_3$ is used in an amount lower than 5 wt %, the dielectric ceramic composition is likely to not be sintered at lower than 900° C. With more than 30 wt % of $B_2O_3$, the dielectric ceramic composition has poor moisture resistance. Thus, its amount is preferably in the range of 5–30 wt. % in the glass frit.

More than 40 wt % of $SiO_2$ results in an excessive increase in the softening temperature of the glass frit which therefore cannot act as a sintering aid. When $SiO_2$ is present in an amount less than 5 wt %, its effect is not obtained. That is, a preferable amount of $SiO_2$ falls within the range of 5–40 wt. %.

With less than 2 wt % of PbO, the glass frit has too high a softening temperature (Ts), making no contribution to the densification of the dielectric ceramic composition. On the other hand, more than 40 wt. % of PbO lowers the Ts of the glass frit to improve the densification of the composition, but has the problem of decreasing Q value. Considering these facts, the amount of PbO in the glass frit is defined in the range of 2–40 wt %.

It is preferred that ZnO is used in an amount of 30–70 wt %. Excessive amounts of ZnO lead to an increase in the softening temperature of the glass frit, making the low temperature firing impossible.

In accordance with another embodiment of the present invention, at least one oxide selected from the group consisting of MgO, CoO, $SiO_2$, $Sb_2O_3$, $Sb_2O_5$, $MnO_2$, and $Ta_2O_5$ is further used in the dielectric ceramic composition of the present invention to improve dielectric properties. With similarity to the main components $ZrO_2$, ZnO, $Nb_2O_5$ and $TiO_2$ in electric charge and ionic radius, the oxides MgO, CoO, $SiO_2$, $Sb_2O_3$, $Sb_2O_5$, $MnO_2$, and $Ta_2O_5$ affect the ionic bonds of the main components to decrease the dielectric loss, functioning to increase the Q value without a large change of dielectric constant and the temperature coefficient of resonant frequency. The oxide is used in an amount of 1.5 wt % or less. At more than 1.5 wt % of the additive oxide, a drastic decrease is brought about in both dielectric constant and Q value.

In accordance with a further embodiment of the present invention, CuO is further used in the dielectric ceramic composition of the present invention. In cooperation with the glass frit, CuO serves as a sintering aid to increase the dielectric constant. Also, CuO plays a role in controlling the temperature coefficient of frequency without a large change in Q value. It is preferably used in an amount of 5 wt % or less. More than solubility limit in the dielectric, CuO exists in the interface, leading to a drastic increase in Q value.

Below, a description will be given of the preparation of the dielectric ceramic composition of the present invention.

The starting materials $ZrO_2$, ZnO, $Nb_2O_5$, and $TiO_2$ with a purity of 99.0% or higher, are weighed according to a desired composition of x $ZrO_2$-y ZnO-w $Nb_2O_5$-z $TiO_2$, and admixed in a wet manner. In this regard, the wet mixing is carried out by milling the starting materials in deionized water for about 16 hours with the aid of 3Φ zirconia balls in a rod mill. The slurry thus obtained is dried and calcined. Preferably, the calcination is carried out at 1,000–1,030° C. for about 2 hours at the heating rate of 5° C./min. When the calcination temperature is lower than 1,000° C., much $ZrO_2$ remains in an unreacted phase, giving rise to an increase in shrinkage. At higher than 1,030° C., on the other hand, the powder becomes too coarse to pulverize later.

After being weighed according to a desired composition, the glass frit components are melted at 1,200–1,400° C., quenched in water, and dry-pulverized. Then, the coarse particles are finely pulverized into powder with a size of 0.5~1.0 μm in ethyl alcohol.

The base dielectric ceramic composition is admixed with the glass frit powder composition, together with appropriate amounts of CuO and at least one additive selected from the group consisting of MgO, CoO, $SiO_2$, $Sb_2O_3$, $Sb_2O_5$, $MnO_2$, and $Ta_2O_5$, in a batch, and the admixture is pulverized.

Following drying, the powder thus obtained was secondarily calcined at 600–700° C. The secondary calcination temperature, which is somewhat higher than the softening temperature (Ts) of the glass frit, makes the dielectric homogenous with the glass frit, thereby improving the uniformity of the dielectric ceramic composition after the sintering.

Next, the calcined powder is further broken down into a desired particle size, mixed with a binder, and molded to a desired form such as a disc or a sheet.

Afterwards, the electrode in a form of disc or sheet is calcined and co-fired at less than 900° C. to produce a desired device.

Having generally described this invention, a further understanding can be obtained by reference to certain specific examples which are provided herein for purposes of illustration only and are not intended to be limiting unless otherwise specified.

EXAMPLE 1

$ZrO_2$, ZnO, $Nb_2O_5$, and $TiO_2$ were weighed according to the composition of x $ZrO_2$-y ZnO-w $Nb_2O_5$-z $TiO_2$ as given in Table 1, below, and admixed in deionized water for 16 hours in the presence of 3Φ zirconia balls using a rod mill.

In Table 1, the base composition 9 further comprised $MnO_2$. To the base compositions 4 and 5, one or two additives selected from among $MnO_2$, $Ta_2O_5$, MgO, $Sb_2O_5$, and $SiO_2$ were added, as shown in Table 2 and 3, below.

The slurry thus obtained was dried, roughly pulverized in a mortar, at heating rate of 5° C./min to a temperature of 1,000–1,030° C. for 2 hours.

Subsequently, the calcined powder was pulverized first in a mortar and then by use of a planetary mill at 200 rpm for 30 min. After being combined with a binder, the pulverized powder was molded into a disc by uniaxial compression at a pressure of 2.0 ton/cm2 using a 14 mmΦ mold. The specimen was sintered at 1,300° C. for 3 hours and measured for dielectric constant (K), Q value, TCF and sintered density. The results are given in Tables 1 to 3, below.

In Tables 1 to 3, the dielectric constant (K) and Q value were measured by the Hakki & Coleman method while the temperature coefficient of resonant frequency (TCF) was measured by the cavity method. TCF was determined between 20 and 85° C. In this regard, the specimen was measured for resonant frequency after being maintained at 20° C., and then heated to and maintained at 85° C. for 30 min prior to re-measurement for resonant frequency. With the measurements, the TCF was determined.

TABLE 1

| No. | Base Composition (mol %) | | | | Additive (wt %) | K | Q | TCF (ppm/° C.) | Sintered Density (g/cm³) |
|---|---|---|---|---|---|---|---|---|---|
| | X | Y | W | Z | | | | | |
| 1 | 46.2 | 1.4 | 1.4 | 51.0 | — | 20.0 | 880 | −45.0 | 4.0 |
| 2 | 41.8 | 3.5 | 3.0 | 51.7 | — | 40.2 | 12,700 | −15.0 | 4.82 |
| 3 | 34.0 | 7.7 | 7.3 | 51.0 | — | 43.5 | 11,800 | −10.0 | 4.88 |
| 4 | 28.2 | 9.3 | 9.5 | 53.0 | — | 42.6 | 12,000 | −2.0 | 4.85 |
| 5 | 25.8 | 10.8 | 10.5 | 52.9 | — | 45.2 | 8,200 | 5.0 | 4.89 |
| 6 | 16.8 | 13.5 | 13.0 | 56.7 | — | 47.0 | 5,000 | 9.0 | 4.82 |
| 7 | 4.9 | 19.2 | 19.1 | 56.8 | — | 65 | 2,800 | 50 | 4.5 |
| 8 | 11.5 | 18.5 | 18.6 | 51.4 | — | 48.2 | 11,700 | 15.0 | 5.0 |
| 9 | 32.0 | 13.0 | 13.2 | 41.8 | $MnO_2$: 0.2 | 41.5 | 15,000 | −5.0 | 5.2 |

TABLE 2

| No. | Base Composition (mol %) | | | | Additive (wt %) | K | Q | TCF (ppm/° C.) | Sintered Density (g/cm³) |
|---|---|---|---|---|---|---|---|---|---|
| | X | y | W | Z | | | | | |
| 5 | 25.8 | 10.8 | 10.5 | 52.9 | | 45.2 | 8,200 | 5.0 | 4.89 |
| 5-1 | | | | | MgO: 0.1 | 46.0 | 9,430 | 6.0 | 4.88 |
| 5-2 | | | | | MgO: 0.5 | 46.2 | 9,470 | 8.0 | 4.87 |
| 5-3 | | | | | MgO: 1.6 | 43.2 | 4,890 | 15.0 | 4.78 |
| 5-4 | | | | | $Ta_2O_5$: 0.1 | 45.0 | 11,700 | 2.5 | 4.87 |
| 5-5 | | | | | $Sb_2O_5$: 0.1 | 44.8 | 13,400 | 4.2 | 4.87 |
| 5-6 | | | | | MgO: 0.1 + $MnO_2$: 0.1 | 45.8 | 10,170 | 3.0 | 4.92 |
| 5-7 | | | | | MgO: 0.1 + $MnO_2$: 0.2 | 45.9 | 10,400 | 1.0 | 4.93 |
| 5-8 | | | | | MgO: 0.3 + $MnO_2$: 0.1 | 46.0 | 10,420 | 5.0 | 4.92 |
| 5-9 | | | | | $Ta_2O_5$: 0.1 + $MnO_2$: 0.1 | 45.6 | 12,860 | 2.0 | 4.93 |
| 5-10 | | | | | $Ta_2O_5$: 0.1 + $MnO_2$: 0.3 | 45.8 | 13,700 | −0.5 | 4.94 |

TABLE 3

| No | Base Composition (mol %) | | | | Additive (wt %) | K | Q | TCF (ppm/° C.) | Sintered Density (g/cm³) |
|---|---|---|---|---|---|---|---|---|---|
| | X | y | W | Z | | | | | |
| 4 | 28.2 | 9.3 | 9.5 | 53.0 | — | 42.6 | 12,000 | −2.0 | 4.85 |

TABLE 3-continued

| No | Base Composition (mol %) | | | | Additive (wt %) | K | Q | TCF (ppm/°C.) | Sintered Density (g/cm³) |
|---|---|---|---|---|---|---|---|---|---|
| | X | y | W | Z | | | | | |
| 4-1 | | | | | $MnO_2$: 0.1 | 43.0 | 12,526 | −3.0 | 4.87 |
| 4-2 | | | | | MgO: 0.1 | 43.2 | 13,180 | −4.0 | 4.88 |
| 4-3 | | | | | $Sb_2O_5$: 0.1 | 43.0 | 12,840 | −1.0 | 4.86 |
| 4-4 | | | | | $SiO_2$: 0.1 | 44.2 | 13,100 | −3.8 | 4.87 |

As shown in Table 1, the dielectric constant and TCF increased with increasing ZnO and $Nb_2O_5$ contents in the base ceramic composition. When the base composition contains ZnO and $Nb_2O_5$ in an amount of about 10 wt % each, its TCF is dramatically changed from a negative value to a positive value.

Also, it can be seen that, with increasing ZnO and $Nb_2O_5$ contents over 10 mol % each, the dielectric constant increases, but the Q value decreases, rather, in some compositions. The reason is that ZnO and $Nb_2O_5$ form a solid-solution of $Zr(Zn,Nb)TiO_4$ when used in an amount of 10 mol % or less, each, but more than 10 mol % of ZnO or $Nb_2O_5$ forms the secondary phase $(ZnNb)TiO_4$ which reduces the Q value. Also, the secondary phase $(ZnNb)TiO_4$ has a TCF of as high as +70 ppm/°C., which leads the TCF of base dielectric ceramic composition to +50 at 19 mol % of ZnO or $Nb_2O_5$. Thus, the composition containing ZnO and $Nb_2O_5$ in an amount more than 19 mol % cannot be used in practice.

It is apparent from the data of Table 2 that a large increase can be brought about in Q value without a large change in dielectric constant and Q value by addition of one or two additives selected from among MgO, $Ta_2O_5$, $Sb_2O_5$, and $MnO_2$ to the composition No. 5 of Table 1.

As can be seen in composition Nos. 5-1 to 5-3, with addition of MgO, the dielectric constant and Q value increase, but causes a drastic decrease in the dielectric constant and Q value when used in more than 1.6 wt %.

Additionally, the data of Table 3 demonstrate that addition of $MnO_2$, MgO, $Sb_2O_3$, or $SiO_2$ greatly increases the Q value with maintenance of dielectric constant and the temperature coefficient of resonant frequency.

EXAMPLE 2

After composition Nos. 8 and 9 of Table 1 were roughly pulverized in respective mortars, the glass frit was added in an amount of 3.0–25.0 wt % to 30 g of each composition as shown in Table 5, below.

The glass frit was prepared by weighing its components according to the compositions of Table 4, melting them at 1,200–1,400° C., quenching in water, dry-pulverizing it to coarse particles, and milling them to a size of 0.5–1.0 μm in ethyl alcohol.

Next, the admixture was dried, and calcined at 600–700° C. for 2 hours.

Subsequently, the calcined powder was pulverized first in a mortar and then milled for 30 min by use of a planetary mill at 200 rpm. After being combined with a binder, the pulverized powder was molded into a disc by uniaxial compression at a pressure of 2.0 ton/cm² using a 14 mmΦ mold. The specimen was sintered at 900 or 1,050° C. for 30 min and measured for dielectric constant (K), Q value, TCF and sintered density. The results are given in Table 5, below.

In Table 5, comparative compositions 2 and 6 were prepared by sintering comparative compositions 1 and 5 at 1,050° C., respectively. Also, the samples were analyzed for sintered state and the results are summarized in Table 5.

Dielectric properties, including dielectric constant (K), Q value, and TCF, were measured in the same manner as in Example 1.

TABLE 4

| Glass Frit No. | $B_2O_3$ | $SiO_2$ | ZnO | PbO |
|---|---|---|---|---|
| Example G 1 | 20 | 10 | 55 | 15 |
| Example G 2 | 15 | 20 | 58 | 7 |
| Comparative G 3 | 3 | 27 | 60 | 10 |
| Comparative G 4 | 35 | 20 | 40 | 5 |
| Comparative G 5 | 20 | 3 | 55 | 22 |
| Comparative G 6 | 15 | 45 | 35 | 5 |
| Comparative G 7 | 20 | 30 | 49 | 1 |
| Comparative G 8 | 10 | 15 | 32 | 43 |
| Comparative G 9 | 12 | 10 | 75 | 3 |

TABLE 5

| Dielectric No. | Dielectric Composition | | Glass Frit (wt %) | CuO (wt %) | K | Q | TCF (ppm/°C.) | Sinter. Temp (°C.) | Note |
|---|---|---|---|---|---|---|---|---|---|
| | Kind | Amount Wt % | | | | | | | |
| Comparative 1 | 8 | 98.0 | 2.0 (G1) | 0 | — | — | — | 900 | [1]P. S. |
| Comparative 2 | 8 | 98.0 | 2.0 (G1) | 0 | 40 | 7,800 | 14.1 | 1050 | Sintered |
| Example 1 | 8 | 97.0 | 3.0 (G1) | 0 | 35 | 6,360 | 13.0 | 900 | Sintered |
| Example 2 | 8 | 96.0 | 3.0 (G1) | 1.0 | 41.3 | 5,830 | 12.5 | 900 | Sintered |
| Example 3 | 8 | 96.0 | 4.0 (G1) | 0 | 36.5 | 6,010 | 12.0 | 900 | Sintered |
| Example 4 | 8 | 92.0 | 8.0 (G1) | 0 | 38.5 | 4,930 | 8.5 | 900 | Sintered |
| Example 5 | 8 | 85.0 | 15.0 (G1) | 0 | 38.9 | 3,170 | 5.0 | 900 | Sintered |
| Example 6 | 8 | 75.0 | 25.0 (G1) | 0 | 32.5 | 2,020 | −14.5 | 900 | Sintered |
| Comparative 3 | 8 | 73 | 27.0 (G1) | 0 | 25.9 | 500 | −25.0 | 900 | Sintered |
| Example 7 | 8 | 94.0 | 3.0 (G1) | 3.0 | 44.3 | 5,600 | 11.0 | 900 | Sintered |
| Example 8 | 8 | 92.0 | 3.0 (G1) | 5.0 | 41.2 | 5,410 | 10.0 | 900 | Sintered |
| Comparative 4 | 8 | 91.0 | 3.0 (G1) | 6.0 | 35.0 | 400 | 6.0 | 900 | Sintered |
| Comparative 5 | 9 | 98.0 | 2.0 (G2) | 0 | — | — | — | 900 | [1]P. S |

TABLE 5-continued

| Dielectric No. | Dielectric Composition | | Glass | | K | Q | TCF (ppm/°C.) | Sinter. Temp (°C.) | Note |
|---|---|---|---|---|---|---|---|---|---|
| | Kind | Amount Wt % | Frit (wt %) | CuO (wt %) | | | | | |
| Comparative 6 | 9 | 98.0 | 2.0 (G2) | 0 | 39.5 | 12,000 | −6.0 | 1050 | Sintered |
| Example 9 | 9 | 97.0 | 3.0 (G2) | 0 | 32.8 | 7,830 | −5.5 | 900 | Sintered |
| Example 10 | 9 | 96.0 | 3.0 (G2) | 1.0 | 37.5 | 7,360 | −4.5 | 900 | Sintered |
| Example 11 | 9 | 96.0 | 4.0 (G2) | 0 | 33.9 | 7,160 | −6.1 | 900 | Sintered |
| Example 12 | 9 | 92.0 | 8.0 (G2) | 0 | 35.8 | 4,120 | −7.9 | 900 | Sintered |
| Example 13 | 9 | 85.0 | 15.0 (G2) | 0 | 36.4 | 3,270 | −12.5 | 900 | Sintered |
| Example 14 | 9 | 75.0 | 25.0 (G2) | 0 | 33.8 | 2,170 | −15.5 | 900 | Sintered |
| Comparative 7 | 9 | 73 | 27.0 (G2) | 0 | 27.5 | 660 | −21.6 | 900 | Sintered |
| Example 15 | 9 | 94.0 | 3.0 (G2) | 3.0 | 38.4 | 7,000 | −3.4 | 900 | Sintered |
| Example 16 | 9 | 92.0 | 3.0 (G2) | 5.0 | 36.8 | 5,000 | −2.5 | 900 | Sintered |
| Comparative 8 | 8 | 92.0 | 8.0 (G3) | 0 | — | — | — | — | [1]P. S |
| Comparative 9 | 8 | 92.0 | 8.0 (G4) | 0 | 32 | 4,100 | −12 | 900 | [2]P. M. |
| Comparative 10 | 8 | 92.0 | 8.0 (G5) | 0 | — | — | — | — | [1]P. S. |
| Comparative 11 | 8 | 92.0 | 8.0 (G6) | 0 | — | — | — | — | [1]P. S. |
| Comparative 12 | 8 | 92.0 | 8.0 (G7) | 0 | — | — | — | — | [1]P. S. |
| Comparative 13 | 8 | 97.0 | 3.0 (G8) | 0 | 36.0 | 420 | 9.0 | 900 | Poor Q |
| Comparative 14 | 8 | 92.0 | 8.0 (G9) | 0 | — | — | — | — | [1]P. S. |

[1]poorly sintered
[2]poor moisture resistance

In addition to being sintered at as low as 900° C., the dielectric ceramic compositions 1–16 of the present invention, as shown in Table 5, have a dielectric constant of 32.5 or higher, a Q value of 2,000 or higher, and a TCF of ±20.0 ppm/° C.

In contrast, comparative compositions 1–14 are poorly sintered at 900° C. or, even if sintered, show poor properties.

The present invention, as described hereinbefore, provides dielectric ceramic compositions that can be cofired with Ag electrode at as low as 900° C. Supplemented with glass frit and CuO, the dielectric ceramic compositions exhibit a dielectric constant of 30 or higher, a Q value of 1,000 or higher, and a TCF of ±20.0 ppm/° C., so that they are suitable for use in multilayered LC filter.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

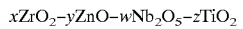

What is claimed is:

1. A dielectric ceramic composition, comprising 75–97 wt % of a base composition represented by the following chemical formula 1:

$$x\text{ZrO}_2\text{-}y\text{ZnO-}w\text{Nb}_2\text{O}_5\text{-}z\text{TiO}_2$$

wherein, 5.0 mol %≦x≦45.0 mol %; 1.5 mol %≦y≦19.0 mol %; 1.5 mol %≦w≦19.0 mol %; 40.0 mol %≦z≦59.0 mol % with the provision that x+y+w+z=100; and 3.0–25 wt % of ZnO—$B_2O_3$—$SiO_2$ based glass frit, wherein the glass frit comprises 30–70 wt % of ZnO, 5–30 wt % of $B_2O_3$, 5–40 wt % of $SiO_2$, and 2–40 wt % of PbO.

2. The dielectric ceramic composition according to claim 1, further comprising an oxide selected from the group consisting of MgO, CoO, $SiO_2$, $Sb_2O_3$, $Sb_2O_5$, $MnO_2$, $Ta_2O_5$, and combinations thereof, in an amount of 1.5 wt % or less.

3. The dielectric ceramic composition according to claim 1, further comprising CuO in an amount of 5.0 wt % or less.

4. The dielectric ceramic composition according to claim 2, further comprising CuO in an amount of 5.0 wt % or less.